US009920286B2

(12) United States Patent
Kumagai et al.

(10) Patent No.: US 9,920,286 B2
(45) Date of Patent: Mar. 20, 2018

(54) CLEANING LIQUID FOR LITHOGRAPHY AND METHOD FOR FORMING WIRING

(71) Applicant: TOKYO OHKA KOGYO CO., LTD., Kawasaki-shi (JP)

(72) Inventors: Tomoya Kumagai, Kawasaki (JP); Takahiro Eto, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 60 days.

(21) Appl. No.: 15/084,295

(22) Filed: Mar. 29, 2016

(65) Prior Publication Data

US 2016/0208201 A1  Jul. 21, 2016

Related U.S. Application Data

(62) Division of application No. 13/913,901, filed on Jun. 10, 2013, now abandoned.

(30) Foreign Application Priority Data

Jun. 11, 2012  (JP) ................................ 2012-132388

(51) Int. Cl.
| | | |
|---|---|---|
| H01L 21/02 | (2006.01) | |
| C11D 7/50 | (2006.01) | |
| G03F 7/42 | (2006.01) | |
| B08B 3/08 | (2006.01) | |
| C11D 7/08 | (2006.01) | |
| C11D 7/26 | (2006.01) | |
| C11D 7/32 | (2006.01) | |

(52) U.S. Cl.
CPC .............. *C11D 7/5022* (2013.01); *B08B 3/08* (2013.01); *C11D 7/08* (2013.01); *C11D 7/263* (2013.01); *C11D 7/3209* (2013.01); *C11D 7/5009* (2013.01); *G03F 7/423* (2013.01); *G03F 7/425* (2013.01); *H01L 21/0206* (2013.01); *H01L 21/02063* (2013.01); *H01L 21/02068* (2013.01)

(58) Field of Classification Search
CPC .................................................. C11D 11/0047
USPC ........................................................ 510/175
See application file for complete search history.

(56) References Cited

U.S. PATENT DOCUMENTS

| 7,442,675 B2 * | 10/2008 | Yokoi ...................... C11D 7/06 134/2 |
| 7,833,957 B2 | 11/2010 | Itano et al. |
| 2004/0259761 A1 * | 12/2004 | Yokoi ...................... C11D 7/06 510/504 |
| 2006/0138399 A1 | 6/2006 | Itano et al. |
| 2007/0082491 A1 | 4/2007 | Uozumi et al. |
| 2008/0268264 A1 * | 10/2008 | Akiyama ................ C08L 83/04 428/447 |
| 2009/0065735 A1 * | 3/2009 | Kolics .................... C11D 7/261 252/79.1 |
| 2010/0007025 A1 * | 1/2010 | Nakagawa ............. C08G 77/60 257/759 |
| 2011/0143149 A1 * | 6/2011 | Shibayama .......... C09D 183/08 428/447 |
| 2011/0214685 A1 | 9/2011 | Kumon et al. |
| 2012/0211025 A1 * | 8/2012 | Kumon ............. H01L 21/02057 134/3 |
| 2013/0056023 A1 * | 3/2013 | Kumon ............. H01L 21/02057 134/1.2 |

FOREIGN PATENT DOCUMENTS

| JP | 2003-503556 A | 1/2003 |
| JP | 2005-522737 A | 7/2005 |
| JP | 2007-134690 A | 5/2007 |
| WO | WO 01/01474 A1 | 1/2001 |
| WO | WO 2003/087936 | 10/2003 |
| WO | WO 2004/019134 A1 | 3/2004 |
| WO | WO 2010/074134 A1 | 7/2010 |

OTHER PUBLICATIONS

Decision of Refusal in Japanese Patent Application No. 2012-132388, dated Dec. 6, 2016.
Office Action in Japanese Patent Application No. 2012-132388, , dated May 17, 2016.

* cited by examiner

*Primary Examiner* — Gregory E Webb
(74) *Attorney, Agent, or Firm* — Knobbe Martens Olson & Bear LLP

(57) ABSTRACT

A cleaning liquid for lithography, and a method for forming a wiring using the cleaning liquid for lithography. The cleaning liquid for includes an alkali or an acid, a solvent, and a silicon compound generating a silanol group through hydrolysis. The method forms a metal wiring layer by embedding a metal in an etching space formed in a low dielectric constant layer of a semiconductor multilayer laminate. In this method, the semiconductor multilayer laminate is cleaned using the cleaning liquid for lithography, after formation of the etching space.

19 Claims, No Drawings

CLEANING LIQUID FOR LITHOGRAPHY AND METHOD FOR FORMING WIRING

RELATED APPLICATIONS

This application is a divisional of U.S. application Ser. No. 13/913,901, filed Jun. 10, 2013, which claims priority under 35 U.S.C. § 119(a)-(d) to Japanese Patent Application No. 2012-132388, filed Jun. 11, 2012, the entire content of which is incorporated herein by reference.

BACKGROUND OF THE INVENTION

Field of the Invention

The present invention relates to a cleaning liquid for lithography. More specifically, the invention relates to a cleaning liquid for lithography that can effectively clean and remove residue materials remaining after etching without corroding corrosion-prone materials such as low dielectric constant materials.

The present invention further relates to a method for forming a wiring using the cleaning liquid for lithography.

Related Art

A semiconductor device laminates a metallic wiring layer, a low dielectric constant layer, an insulation layer, or the like on a substrate such as a silicon wafer, and the like. This type of semiconductor device is manufactured by processing each layer using a lithography method that employs an etching process using a resist pattern as a mask.

The resist film or a temporary laminate film (termed "a sacrificial film") used in the lithography method, and furthermore residue material produced during the etching process is removed using a cleaning liquid to prevent an adverse effect on the semiconductor device, and furthermore to prevent impediment to a subsequent processing step.

In recent years, methods for forming a wiring using a damascene method have been employed in respond to advances in high-density and highly integrated semiconductor devices. Copper that is prone to undergo corrosion is used as a metallic wiring material that configures the metallic wiring layer of the semiconductor device in this type of wiring formation method. Furthermore, a low dielectric constant material (termed an "Low-k material") is used to configure the low dielectric constant layer. Advances in achieving a low dielectric constant have resulted in use of such Low-k materials that are prone to undergo corrosion. Consequently, there is a need for development of a cleaning liquid that does not cause corrosion of such corrosion-prone materials when cleaning the substrate.

In particular, a Low-k material having a dielectric constant (k) of 2.5 or less, which is called an ultra-Low-k (ULK) material, is very easily damaged by an alkali or an acid used as a cleaning liquid and tends to thereby readily cause changes in size, k value, contact angle, etc. Such damage occurs not only in the cleaning step with a cleaning liquid but also in steps of CMP, etching, and ashing. As the ULK material, for example, a porous $SiO_2$ film is used.

Conventionally, in order to inhibit damage of ULK materials, cleaning is performed using a weak alkaline cleaning liquid having a lowered pH. This can certainly inhibit damage of ULK materials, but reduces the ability of removing residue materials.

In order to reduce the damage during cleaning of a ULK material, a method for treating the damaged surface of the ULK material by etching with a supercritical silylating agent and a supercritical solvent has been proposed (Patent Literature 1). This method can at least partially passivate the surface of a ULK material. Therefore, even if the etched ULK material is treated with a cleaning liquid, the damage of the ULK material can be suppressed to a minimum.
[Patent Document 1] Japanese Unexamined Patent Application, Publication No. 2005-522737

SUMMARY OF THE INVENTION

The treatment described in Patent Literature 1 needs to perform two steps, a step of cleaning and a step of passivating the surface of a ULK material, for removing residue materials remaining after etching. Accordingly, a cleaning liquid for lithography that can effectively remove residue materials by only one step has been in demand.

The present invention was made in the light of the conventional circumstances as described above, and an object of the present invention is to provide a cleaning liquid for lithography that shows an excellent corrosion-inhibiting effect on Low-k materials and has an excellent ability of removing residue materials remaining after etching and can therefore remove the residue materials by one step, and a method for forming a wiring using the cleaning liquid for lithography.

The present inventors have diligently studied to solve the above-mentioned problems. As a result, the inventors have found that the above-mentioned problems can be solved by adding a silicon compound generating a silanol group through hydrolysis to a cleaning liquid for lithography, and the present invention has been accomplished. Specifically, the present invention provides the followings.

A first aspect of the present invention is a cleaning liquid for lithography including an alkali or an acid, a solvent, and a silicon compound generating a silanol group through hydrolysis.

A second aspect of the present invention is a method for forming a wiring which forms a metallic wiring layer by embedding a metal in an etching space that is formed in a low dielectric constant layer of a semiconductor multilayer laminate, including: cleaning the semiconductor multilayer laminate using the cleaning liquid for lithography according to the present invention, after formation of the etching space.

According to the present invention, a cleaning liquid for lithography can be provided that shows an excellent corrosion-inhibiting effect on Low-k materials and has an excellent ability of removing residue materials remaining after etching and can therefore effectively remove the residue materials by one step, and a method for forming a wiring using the cleaning liquid for lithography can be provided.

DETAILED DESCRIPTION OF THE INVENTION

Cleaning Liquid for Lithography

The cleaning liquid for lithography according to the present invention contains an alkali or an acid, a solvent, and silicon compound generating a silanol group through hydrolysis. The cleaning liquid for lithography according to the present invention can be used in, for example, cleaning of a laminate including a low dielectric constant layer. Examples of the laminate include semiconductor multilayer laminates including low dielectric constant layers. The cleaning liquid comes into direct contact with the low dielectric constant layer during the cleaning in some cases depending on the processing states of the laminates. Even in such cases, however, the low dielectric constant layer is prevented from corrosion. The main purpose of the cleaning of the laminate may be other than cleaning of the low dielectric constant layer and may be, for example, removal of the metal hard mask layer disposed on the low dielectric constant layer.

The present invention will now be described in detail. Each material can be a commercially available one unless otherwise mentioned.

Alkali or Acid

Any alkali that can remove residue materials remaining after etching can be used without any limitation. Such alkalis may be used alone or in combination of two or more thereof.

The alkali can be, for example, a quaternary ammonium hydroxide. The quaternary ammonium hydroxide is preferably a compound represented by the following general formula (2):

(2)

In the above general formula (2), $R^3$ to $R^6$ each independently represent an alkyl, aryl, aralkyl, or hydroxyalkyl group having 1 to 16 carbon atoms.

Among the compounds represented by the above general formula (2), the quaternary ammonium hydroxide is particularly preferably at least one selected from the group consisting of tetramethylammonium hydroxide, tetraethylammonium hydroxide, tetrapropylammonium hydroxide, tetrabutylammonium hydroxide, methyltripropylammonium hydroxide, methyltributylammonium hydroxide, ethyltrimethylammonium hydroxide, dimethyldiethylammonium hydroxide, benzyltrimethylammonium hydroxide, hexadecyltrimethylammonium hydroxide, and (2-hydroxyethyl) trimethylammonium hydroxide, because of easy availability thereof. Furthermore, residue materials remaining after etching show high solubility in tetramethylammonium hydroxide and/or tetraethylammonium hydroxide, and therefore these hydroxides are preferred.

As the alkali, an alkanolamine may be used. For example, the alkanolamine includes monoethanolamine, diethanolamine, triethanolamine, 2-(2-amino-ethoxy) ethanol, N,N-dimethylethanolamine, N, N-diethylethanolamine, N, N-dibutylethanolamine, N-methylethanolamine, N-ethylethanolamine, N-butylethanolamine, N-methyldiethanolamine, monoisopropanolamine, diisopropanolamine, triisopropanolamine, or the like.

The alkali may be, for example, a combination of an inorganic base and a quaternary ammonium hydroxide. The inorganic base is preferably an alkali-metal hydroxide including potassium hydroxide, sodium hydroxide, rubidium hydroxide, or the like, with potassium hydroxide being more preferred.

The amount of the quaternary ammonium hydroxide as an alkali is preferably 0.05 to 10% by mass, more preferably 0.1 to 5% by mass, based on the total amount of the cleaning liquid for lithography; and the amount of the alkanol amine as an alkali is preferably 0.05 to 20% by mass, more preferably 0.1 to 10% by mass, based on the total amount of the cleaning liquid for lithography. The use of an alkali in such an amount can effectively remove residue materials remaining after etching while inhibiting corrosion of Low-k materials, etc. In the case of using an inorganic base together with a quaternary ammonium hydroxide, the amount of the inorganic base is preferably 0.1 ppm by mass to 1% by mass, more preferably 1 to 1000 ppm by mass, based on the total amount of the cleaning liquid for lithography. The use of the inorganic base in such an amount can enhance the ability of removing residue materials remaining after etching while inhibiting corrosion of Low-k materials, etc.

Any acid that can remove residue materials remaining after etching can be used without any limitation, and examples thereof include hydrofluoric acid. Such acids may be used alone or in combination of two or more thereof.

The amount of the acid is preferably 1 ppm by mass to 10% by mass, more preferably 100 ppm by mass to 5% by mass, based on the total amount of the cleaning liquid for lithography. The use of an acid in such an amount can effectively remove residue materials remaining after etching while inhibiting corrosion of Low-k materials, etc.

Solvent

The solvent may be a compound that is commonly used in the field of the art. The solvents are roughly classified into organic solvents and water and may be appropriately selected or may be used in a combination.

Examples of the organic solvent include sulfoxides such as dimethyl sulfoxide; sulfones such as dimethyl sulfone, diethyl sulfone, bis(2-hydroxyethyl) sulfone, and tetramethylene sulfone; amides such as N,N-dimethyl formamide, N-methyl formamide, N,N-dimethyl acetamide, N-methyl acetamide, and N,N-diethyl acetamide; lactams such as N-methyl-2-pyrolidone, N-ethyl-2-pyrolidone, N-hydroxymethyl-2-pyrolidone, and N-hydroxyethyl-2-pyrolidone; lactones such as β-propiolactone, γ-butyrolactone, γ-valerolactone, δ-valerolactone, γ-caprolactone, and ε-caprolactone; imidazolidinones such as 1,3-dimethyl-2-imidazolidinone, 1,3-diethyl-2-imidazolidinone, and 1,3-diisopropyl-2-imidazolidinone; polyols such as ethylene glycol, propylene glycol, 1,2-butylene glycol, 1,3-butylene glycol, 2,3-butylene glycol, glycerin, and diethylene glycol; glycol ether solvents such as ethylene glycol monomethyl ether, ethylene glycol monoethyl ether, ethylene glycol monopropyl ether, ethylene glycol monobutyl ether, ethylene glycol monoallyl ether, propylene glycol monomethyl ether, propylene glycol monoethyl ether, propylene glycol monopropyl ether, propylene glycol monobutyl ether, 3-methoxy-3-methyl-1-butanol, diethylene glycol monomethyl ether, diethylene glycol monoethyl ether, diethylene glycol monopropyl ether, diethylene glycol monobutyl ether, diethylene glycol monobenzyl ether, dipropylene glycol monomethyl ether, dipropylene glycol monoethyl ether, dipropylene glycol monopropyl ether, dipropylene glycol monobutyl ether, triethylene glycol monomethyl ether, triethylene glycol monoethyl ether, triethylene glycol monopropyl ether, triethylene glycol monobutyl ether, tripropylene glycol monobutyl ether, ethylene glycol dimethyl ether, diethylene glycol dimethyl ether, triethylene glycol dimethyl ether, tetraethylene glycol dimethyl ether, diethylene glycol methyl ethyl ether, and diethylene glycol diethyl ether; and glycol ester solvents such as ethylene glycol monoacetate, ethylene glycol monomethyl ether acetate, ethylene glycol monoethyl ether acetate, and diethylene glycol monoacetate.

In particular, the organic solvent is preferably at least one selected from the group consisting of 3-methoxy-3-methyl-1-butanol, dimethyl sulfoxide, propylene glycol monomethyl ether, propylene glycol monoethyl ether, propylene glycol monopropyl ether, diethylene glycol monoethyl ether, diethylene glycol monobutyl ether, and triethylene glycol monobutyl ether. The organic solvents may be used as a mixture of two or more thereof as necessary.

In the case of using an organic solvent and water as a solvent mixture, the organic solvent is preferably a water-soluble organic solvent. Examples of the water-soluble organic solvent include the above-mentioned sulfoxides, sulfones, amides, lactams, lactones, imidazolidinones; polyols; glycol ether solvents; and glycol ester solvents.

The amount of the solvent is preferably 1 to 99.7% by mass, more preferably 2 to 99.5% by mass, based on the total amount of the cleaning liquid for lithography. The use of a solvent in such an amount can effectively remove residue materials remaining after etching while inhibiting corrosion of Low-k materials, etc.

In the case of using a mixture of an organic solvent and water, the amount of the water is preferably 10 to 80% by mass, more preferably 15 to 70% by mass, based on the total amount of the cleaning liquid for lithography. The amount of the organic solvent in a solvent mixture composed of the organic solvent and water is the balance of the water in the entire solvent mixture. In the present invention, only an organic solvent may be used as the solvent.

Silicon Compound Generating Silanol Group Through Hydrolysis

The surface of a Low-k material such as a ULK material is damaged in the steps such as CMP, etching, ashing, and cleaning to cut the Si—O—Si bond to generate silanol groups: Si—OH. It is assumed that these silanol groups are attacked by the alkali or the acid in a cleaning liquid to make corrosion of the Low-k material proceed.

The silicon compound generating a silanol group through hydrolysis is hydrolyzed in the cleaning liquid for lithography according to the present invention to generate a silanol group. The thus-generated silanol groups polymerize the silicon compound through dehydration condensation and also bind to the silanol groups generated on the surface of the damaged Low-k material to cause dehydration condensation. It is assumed that, as a result, the surface of the Low-k material is covered with a film composed of a polymer of the silicon compound and is thereby protected from being damaged by the alkali or the acid in the cleaning liquid for lithography.

Any silicon compound generating a silanol group through hydrolysis can be used without specific restriction, and, for example, an alkoxysilane or its partial hydrolysis condensate can be used. Preferred examples thereof include alkoxysilanes represented by the following formula (1) and partial hydrolysis condensates thereof:

$$R^1_{4-n}Si(OR^2)_n \quad (1)$$

wherein $R^1$ represents an organic group, $R^2$ represents an alkyl group having 1 to 4 carbon atoms; and n is an integer of 1 to 4.

Examples of the organic group represented by $R^1$ include a hydrocarbon group that may have substituents. The hydrocarbon groups preferably has 1 to 20 carbon atoms. Examples of the hydrocarbon group include an alkyl group, a cycloalkyl group, an alkenyl group, an aryl group, and an aralkyl group, and these groups may have substituents.

Examples of the substituent include a 3,4-epoxycyclohexyl group, a glycidoxy group, a 3-acryloyloxy group, a 3-methacryloyloxy group, a 2-aminoethylamino group, an amino group, a methylbutylketimino group, a phenylamino group, an ureido group, a mercapto group, an isocyanate group, and a halogen atom (e.g., fluorine and chlorine atoms). In the case that the hydrocarbon group has a substituent, the number of the substituent may be one or two or more.

The alkyl group preferably has 1 to 20 carbon atoms, and examples thereof include a methyl group, an ethyl group, a propyl group, an isopropyl group, an n-butyl group, an isobutyl group, a sec-butyl group, a tert-butyl group, a pentyl group, an isopentyl group, a neopentyl group, a hexyl group, an octyl group, a decyl group, a dodecyl group, a tetradecyl group, a hexadecyl group, an octadecyl group, an icosyl group, a 3,3,3-trifluoropropyl group, a 2-(3,4-epoxycyclohexyl)ethyl group, a 3-glycidoxypropyl group, a 3-acryloyloxypropyl group, a 3-methacryloyloxypropyl group, an N-2-(aminoethyl)-3-aminopropyl group, a 3-aminopropyl group, a 3-methylbutylketiminopropyl group, an N-phenyl-3-aminopropyl group, a 3-ureidopropyl group, a 3-mercaptopropyl group, and a 3-isocyanatepropyl group.

The cycloalkyl group preferably has 3 to 20 carbon atoms, and examples thereof include a cyclopentyl group and a cyclohexyl group.

The alkenyl group preferably has 2 to 20 carbon atoms, and examples thereof include a vinyl group and an allyl group.

The aryl group preferably has 6 to 20 carbon atoms, and examples thereof include a phenyl group, a tolyl group, a vinylphenyl group, and a naphthyl group.

The aralkyl group preferably has 7 to 20 carbon atoms, and examples thereof include a benzyl group and a phenethyl group.

Examples of the alkyl group represented by $R^2$ include a methyl group, an ethyl group, a propyl group, an isopropyl group, an n-butyl group, an isobutyl group, a sec-butyl group, and a tert-butyl group. In particular, a methyl group and an ethyl group are preferred from the viewpoint of easy availability of the silicon compound.

n is preferably an integer of 1 to 3, more preferably 1 or 2, for providing a satisfactory state of the surface of the semiconductor multilayer laminate cleaned with the cleaning liquid for lithography according to the present invention.

The silicon compounds generating silanol groups through hydrolysis may be used alone or in a combination of two or more thereof. Specific examples of the silicon compound include methyltrimethoxysilane, dimethyldimethoxysilane, trimethylmethoxysilane, phenyltrimethoxysilane, dimethoxymethylphenylsilane, tetraethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, decyltrimethoxysilane, trifluoropropyltrimethoxysilane, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, p-vinylphenyltrimethoxysilane, 3-methacryloyloxypropylmethyldimethoxysilane, 3-methacryloyloxypropyltrimethoxysilane, 3-methacryloyloxypropylmethyldiethoxysilane, 3-methacryloyloxypropyltriethoxysilane, acryloyloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, hydrochloride of N-(vinylbenzyl)-2-aminoethyl-3-aminopropyltrimethoxysilane, 3-ureidopropyltriethoxysilane, 3-mercaptopropylmethyldimethoxysilane, 3-mercaptopropyltrimethoxysilane, bis(triethoxysilylpropyl)tetrasulfide, and 3-isocyanatepropyltriethoxysilane. In particular, preferred are methyltrimethoxysilane, dimethyldimethoxysilane, trimethylmethoxysilane, dimethoxymethylphenylsilane, n-propyltriethoxysilane, 2-(3,4-epoxycyclohexyl)ethyltrimethoxysilane, N-2-(aminoethyl)-3-aminopropylmethyldimethoxysilane, and 3-aminopropyltrimethoxysilane, from the viewpoints of easy availability of the silicon compound and less influence on the Low-k materials; and particularly preferred are methyltrimethoxysilane, dimethyldimethoxysilane, trimethylmethoxysilane, and dimethoxymethylphenylsilane, because of their excellent characteristics.

The amount of the silicon compound generating a silanol group through hydrolysis is preferably 5% by mass or less, more preferably 1% by mass or less, based on the total amount of the cleaning liquid for lithography. The use of the silicon compound in such an amount prevents excessive polymerization of the silicon compound and also can prevent excessive formation of the silicon compound-derived film on the surface of the low dielectric constant layer, resulting in inhibition of an increase and defects in size. In addition, the resulting cleaning liquid for lithography hardly causes white turbidity and has satisfactory storage stability. Furthermore, the amount of the silicon compound is preferably 0.01% by mass or more, more preferably 0.1% by mass or more, based on the total amount of the cleaning liquid for lithography. The use of the silicon compound in such an amount allows effective removal of residue materials remaining after etching while inhibiting corrosion of Low-k materials, etc.

Other Components

The cleaning liquid for lithography according to the present invention may further contain other components. Examples of the other ingredients include an anticorrosive agent and a surfactant.

(Anticorrosive Agent)

The anticorrosive agent used is at least one selected from imidazole compounds, benzotriazole compounds, and mercapto group-containing compounds.

Examples of the imidazole compound include compounds represented by the following general formula (3):

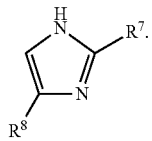

(3)

In the above general formula (3), $R^7$ represents an alkyl group or an aryl group having 1 to 17 carbon atoms, and $R^8$ represents an alkyl group having 1 to 13 carbon atoms. $R^7$ is preferably an alkyl group or an aryl group having 1 to 11 carbon atoms, and more preferably an alkyl group having 1 to 6 carbon atoms or a phenyl group. $R^8$ is preferably an alkyl group having 1 to 6 carbon atoms, and more preferably a methyl or an ethyl group. The alkyl group may be any of a straight-chain, branched-chain or cyclic alkyl group.

Of the compounds represented by the above general formula (3), at least one compound may be selected from the group consisting of 2-ethyl-4-methyl imidazole, 2-methyl-4-ethyl imidazole, 2,4-dimethyl imidazole, 2-n-butyl-4-methyl imidazole, 2-cyclohexyl-4-methyl imidazole, and 2-phenyl-4-methyl imidazole.

The content amount of the compounds represented by the above general formula (3) is preferably 0.1 to 10 mass %, and more preferably 0.5 to 5 mass % relative to the total amount of the cleaning liquid for lithography. This content amount enables suppression of corrosion of a metal while at the same time enabling effective removal of residual material remaining after etching.

The benzotriazole compound includes compounds represented by the following general formula (4):

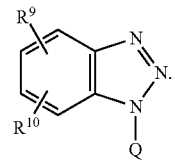

(4)

In the above general formula (4), $R^9$ and $R^{10}$ independently represent a hydrogen atom, a hydrocarbon group having 1 to 10 carbon atoms that may includes a substitution group, a carboxyl group, an amino group, a hydroxyl group, a cyano group, a formyl group, a sulfonylalkyl group, or a sulfo group, Q represents a hydrogen atom, a hydroxyl group, a hydrocarbon group having 1 to 14 carbon atoms that may include a substitution group and that may be interrupted by amide bonds or ester bonds, or a group represented by the following general formula (5):

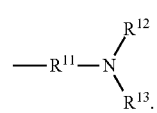

(5)

In the above general formula (5), $R^{11}$ represents an alkylene group having 1 to 6 carbon atoms, $R^{12}$ and $R^{13}$ independently represent a hydrogen atom, a hydroxyl group, or a hydroxyalkyl group or an alkoxyalkyl group having 1 to 6 carbon atoms.

In each of the definitions of $R^9$, $R^{10}$, and Q in the above general formula (4), the hydrocarbon group may be either an aromatic hydrocarbon group or an aliphatic hydrocarbon group, may include unsaturated bonds, and may be straight-chained, branched-chained or cyclic hydrocarbon group. The aromatic hydrocarbon group may be for example a phenyl group, a p-tolyl group, or the like. The straight-chained aliphatic hydrocarbon group may be for example a methyl group, an n-propyl group, a vinyl group, or the like. The branched-chained aliphatic hydrocarbon group for example may be an i-butyl group, a t-butyl group, or the like. A cyclic aliphatic hydrocarbon group for example may be a cyclopentyl group, a cyclohexyl group, or the like. A hydrocarbon group including a substitution group may be for example a hydroxyalkyl group, an alkoxyalkyl group, or the like.

Q in the above general formula (4) is preferably a group represented in the above general formula (5). In particular, of the groups represented in the above general formula (5), $R^{12}$ and $R^{13}$ are preferably independently selected from a hydroxyalkyl group or an alkoxyalkyl group having 1 to 6 carbon atoms.

Furthermore Q is preferably selected so that the compound represented by the above general formula (4) exhibits water-soluble properties. More specifically, a hydrogen atom, an alkyl group having 1 to 3 carbon atoms (that is to say, a methyl group, an ethyl group, a propyl group, an isopropyl group), a hydroxyalkyl group having 1 to 3 carbon atoms, a hydroxyl group, or the like are preferred.

For example, the benzotriazole compound more specifically includes benzotriazole, 5,6-dimethylbenzotriazole, 1-hydroxybenzotriazole, 1-methylbenzotriazole, 1-aminobenzotriazole, 1-phenylbenzotriazole, 1-hydoxymethylbenzotriazole, methyl 1-benzotriazolecarboxylate, 5-benzotriazolecarboxylic acid, 1-methoxybenzotriazole, 1-(2,2-dihydroxyethyl)benzotriazole, 1-(2,3-dihydroxypropyl) benzotriazole; and 2,2'-[[(4-methyl-1H-benzotriazol-1-yl)methyl]imino]bisethanol, 2,2'-[[(5-methyl-1H-benzotriazol-1-yl)methyl]imino]bisethanol, 2,2'-[[(4-methyl-1H-benzotriazol-1-yl)methyl]imino]bisethane, 2,2'-[[(4-methyl-1H-benzotriazol-1-yl)methyl]imino]bispropane, and the like that are commercially available from Chiba Specialty Chemicals Co., Ltd. as the "IREGAMET" series. Of the above compounds, 1-(2,3-dihydroxypropyl)benzotriazole, 2,2'-[[(4-methyl-1H-benzotriazol-1-yl)methyl]imino] bisethanol, 2,2'-[[(5-methyl-1H-benzotriazol-1-yl)methyl] imino]bisethanol, and the like are preferably used. These benzotriazole compounds may be used either singly or in combination of two or more compounds.

The mercapto group containing compound above is preferably a compound containing a hydroxyl group and/or a carboxyl group on at least one of the α-position and the β-position of a carbon atom that is bonded to the mercapto group. More specifically, such compounds include 1-thioglycerol, 3-(2-aminophenylthio)-2-hydroxypropylmercaptane, 3-(2-hydroxyethylthio)-2-hydroxypropylmercaptane, 2-mercaptopropionate, 3-mercaptopropionate, or the like. Of the above compounds, use of 1-thioglycerol is particularly preferred.

The mercapto group-containing compound is preferably a compound represented by the following formula (6):

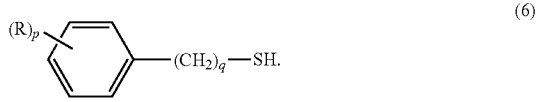

In the formula (6), R represents a group selected from the group consisting of a hydroxyl group, an alkyl group having 1 to 4 carbon atoms, an alkoxy group having 1 to 4 carbon atoms, an alkylthio group having 1 to 4 carbon atoms, a hydroxyalkyl group having 1 to 4 carbon atoms, a mercaptoalkyl group having 1 to 4 carbon atoms, a halogenated alkyl group having 1 to 4 carbon atoms and a halogen atom; p is an integer of 1 to 3; and q is an integer of 0 to 3, wherein provided that p is 2 or 3, R may be the same or different.

Specific examples of the case in which R represents an alkyl group having 1 to 4 carbon atoms include a methyl group, an ethyl group, a n-propyl group, an iso-propyl group, a n-butyl group, an iso-butyl group, a sec-butyl group, and a tert-butyl group. Among these alkyl groups, a methyl group or an ethyl group is preferred since suitable solubility in a solvent can be attained, and a methyl group is more preferred since the anticorrosive effect is further improved.

Specific examples of the case in which R represents an alkoxy group having 1 to 4 carbon atoms include a methoxy group, an ethoxy group, a n-propyloxy group, an iso-propyloxy group, a n-butyloxy group, an iso-butyloxy group, a sec-butyloxy group, and a tert-butyloxy group. Among these alkoxy groups, a methoxy group or an ethoxy group is preferred since suitable solubility in a solvent can be attained, and a methoxy group is more preferred since the anticorrosive effect is further improved.

Specific examples of the case in which R represents an alkylthio group having 1 to 4 carbon atoms include a methylthio group, an ethylthio group, a n-propylthio group, an iso-propylthio group, a n-butylthio group, an iso-butylthio group, a sec-butylthio group, and a tert-butylthio group. Among these alkylthio groups, a methylthio group or an ethylthio group is preferred since suitable solubility in a solvent can be attained, and a methylthio group is more preferred since the anticorrosive effect is further improved.

Specific examples of the case in which R represents a hydroxyalkyl group having 1 to 4 carbon atoms include a hydroxymethyl group, a 2-hydroxyethyl group, a 1-hydroxyethyl group, a 3-hydroxy-n-propyl group, a 4-hydroxy-n-butyl group, and the like. Among these hydroxyalkyl groups, a hydroxymethyl group, a 2-hydroxyethyl group or a 1-hydroxyethyl group is preferred since suitable solubility in a solvent can be attained, and a hydroxymethyl group is more preferred since the anticorrosive effect is further improved.

Specific examples of the case in which R represents a mercaptoalkyl group having 1 to 4 carbon atoms include a mercaptomethyl group, a 2-mercaptoethyl group, a 1-mercaptoethyl group, a 3-mercapto-n-propyl group, a 4-mercapto-n-butyl group, and the like. Among these mercaptoalkyl groups, a mercaptomethyl group, a 2-mercaptoethyl group or a 1-mercaptoethyl group is preferred since suitable solubility in a solvent can be attained, and a mercaptomethyl group is more preferred since the anticorrosive effect is further improved.

In the case in which R represents a halogenated alkyl group having 1 to 4 carbon atoms, examples of the halogen atom included in the halogenated alkyl group include a fluorine atom, a chlorine atom, a bromine atom, an iodine atom, and the like. Specific examples of the case in which R represents a halogenated alkyl group having 1 to 4 carbon atoms include a chloromethyl group, a bromomethyl group, an iodomethyl group, a fluoromethyl group, a dichloromethyl group, a dibromomethyl group, a difluoromethyl group, a trichloromethyl group, a tribromomethyl group, a trifluoromethyl group, a 2-chloroethyl group, a 2-bromoethyl group, a 2-fluoroethyl group, a 1,2-dichloroethyl group, a 2,2-difluoroethyl group, a 1-chloro-2-fluoroethyl group, a 3-chloro-n-propyl group, a 3-bromo-n-propyl group, a 3-fluoro-n-propyl group, a 4-chloro-n-butyl group, and the like. Among these halogenated alkyl groups, a chloromethyl group, a bromomethyl group, an iodomethyl group, a fluoromethyl group, a dichloromethyl group, a dibromomethyl group, a difluoromethyl group, a trichloromethyl group, a tribromomethyl group or a trifluoromethyl group is preferred, and a chloromethyl group, a dichloromethyl group, a trichloromethyl group or a trifluoromethyl group is more preferred since the anticorrosive effect is further improved.

In the case in which R represents a halogen atom, specific examples of the halogen atom include a fluorine atom, chlorine, a bromine atom, and an iodine atom.

In the formula (6), p is an integer of 1 to 3, and more preferably 1. Provided that p is 2 or 3, R may be the same or different.

In the compound represented by the formula (6), the position of substitution with R on the benzene ring is not particularly limited. Since a superior anticorrosive effect is likely to be achieved, the position of substitution with R on the benzene ring is preferably a meta- or para-position with respect to the position at which —(CH$_2$)$_q$—SH binds.

As the compound represented by the formula (6), due to superior anticorrosive properties for corrosion-prone materials, and superior stability in the cleaning liquid for lithography, a compound having at least one group selected from the group consisting of an alkyl group, a hydroxyalkyl group and a mercaptoalkyl group as R is preferred, and a compound having one group selected from the group consisting of an alkyl group, a hydroxyalkyl group and a mercaptoalkyl group as R is more preferred. In the case in which the compound represented by the formula (6) has one group selected from the group consisting of an alkyl group, a hydroxyalkyl group and a mercaptoalkyl group as R, the position of substitution with an alkyl group, a hydroxyalkyl group, or a mercaptoalkyl group on the benzene ring is preferably a meta- or para-position and more preferably a para-position with respect to the position at which —$(CH_2)_q$—SH binds.

In the formula (6), q is an integer of 0 to 3. Due to ease in preparation and availability of the compound q is preferably 0 or 1, and more preferably 0.

Specific examples of the compound represented by the formula (6) include p-mercaptophenol, p-thiocresol, m-thiocresol, 4-(methylthio)benzenethiol, 4-methoxybenzenethiol, 3-methoxybenzenethiol, 4-ethoxybenzenethiol, 4-isopropyloxy benzenethiol, 4-tert-butoxybenzenethiol, 3,4-dimethoxy benzenethiol, 3,4,5-trimethoxybenzenethiol, 4-ethylbenzenethiol, 4-isopropyl benzenethiol, 4-n-butylbenzenethiol, 4-tert-butylbenzenethiol, 3-ethylbenzenethiol, 3-isopropyl benzenethiol, 3-n-butylbenzenethiol, 3-tert-butylbenzenethiol, 3,5-dimethyl benzenethiol, 3,4-dimethyl benzenethiol, 3-tert-butyl-4-methylbenzenethiol, 3-tert-4-methylbenzenethiol, 3-tert-butyl-5-methylbenzenethiol, 4-tert-butyl-3-methylbenzenethiol, 4-mercaptobenzyl alcohol, 3-mercaptobenzyl alcohol, 4-(mercaptomethyl)phenol, 3-(mercaptomethyl)phenol, 4-fluorobenzenethiol, 3-fluorobenzenethiol, 4-chlorobenzenethiol, 3-chlorobenzenethiol, 4-bromobenzenethiol, 4-iodobenzenethiol, 3-bromobenzenethiol, 3,4-dichlorobenzenethiol, 3,5-dichlorobenzenethiol, 3,4-difluorobenzenethiol, 3,5-difluorobenzenethiol, 4-mercaptocatechol, 2,6-di-tert-butyl-4-mercaptophenol, 3,5-di-tert-butyl-4-methoxybenzenethiol, 4-bromo-3-methylbenzenethiol, 4-(trifluoromethyl)benzenethiol, 3-(trifluoromethyl)benzenethiol, 3,5-bis(trifluoromethyl)benzenethiol, 4-methylthiobenzenethiol, 4-ethylthiobenzenethiol, 4-n-butylthiobenzenethiol, and 4-tert-butylthiobenzenethiol, and the like. Among these compounds, due to high anticorrosive effects on corrosion-prone materials, and favorable availability, p-mercaptophenol, p-thiocresol, m-thiocresol, 4-(methylthio)benzenethiol, 4-methoxybenzenethiol, 4-ethylbenzenethiol, 4-isopropyl benzenethiol, 4-fluorobenzenethiol, 4-chlorobenzenethiol, and 4-bromobenzenethiol are more preferred. In addition, due to high anticorrosive effects on corrosion-prone materials, and superior stability in the cleaning liquid for lithography, 4-mercaptobenzyl alcohol and 4-(mercaptomethyl) phenol are also preferred.

The compound represented by the formula (6) may be contained in the cleaning liquid for lithography in any amount that does not inhibit the cleaning effect of the cleaning liquid and allows uniform dissolution of the compound represented by the formula (6) in the cleaning liquid. The amount of the compound represented by the formula (6) in the cleaning liquid for lithography is preferably 0.05 to 5.0% by mass, more preferably 0.1 to 1.0% by mass, based on the mass of the cleaning liquid. In the case of the cleaning liquid for lithography containing the compound represented by the formula (6) in such an amount range, a satisfactory anticorrosive effect on corrosion-prone materials is achieved, and also the compound represented by the formula (6) is easily prevented from precipitating when a subject cleaned with the cleaning liquid is rinsed with, for example, water. The cleaning liquid for lithography may contain two or more compounds in combination represented by the formula (6).

The mercapto group-containing compound is preferably a linear mercapto alcohol compound represented by the following formula (7):

HS—$(CH_2)_x$—OH  (7)

wherein x is an integer of 3 or more.

In the formula (7), x is an integer of no less than 3, and the upper limit thereof is not particularly limited within the range not resulting in impairment of the object of the present invention. In light of the ability to favorably inhibit corrosion resulting from the cleaning liquid for lithography, x is preferably an integer of no less than 3 and no greater than 10, and more preferably an integer of no less than 3 and no greater than 9. When the compound in which x falls within such a range is used as an anticorrosive agent, the anticorrosive agent is likely to be dissolved in the cleaning liquid for lithography, whereby a favorable anticorrosive effect can be readily achieved. Also, in this case, when the object to be cleaned after cleaning is rinsed with water, deposition of the compound represented by the formula (7) as an anticorrosive agent can be suppressed.

Although the compound in which x is an integer of less than 3 is readily dissolved in the cleaning liquid for lithography, it exhibits an inferior anticorrosive effect. Although the compound in which x is greater than 10 exhibits a favorable anticorrosive effect, when a cleaning liquid for lithography containing such a compound is used, rinsing with water after cleaning may cause deposition on the surface of the object to be cleaned. Therefore, when a cleaning liquid for lithography containing the compound in which x is an integer of greater than 10 is used, the cleaning is preferably followed by rinsing with an organic solvent, and then rinsing with water as needed.

Suitable examples of the compound represented by the formula (7) include:

HS—$(CH_2)_3$—OH,

HS—$(CH_2)_4$—OH,

HS—$(CH_2)_5$—OH,

HS—$(CH_2)_6$—OH,

HS—$(CH_2)_7$—OH,

HS—$(CH_2)_8$—OH,

HS—$(CH_2)_9$—OH, and

HS—$(CH_2)_{10}$—OH.

The content of the compound represented by the formula (7) in the cleaning liquid for lithography is not particularly limited as long as it does not inhibit the cleaning effect of the cleaning liquid, and the compound represented by the formula (7) can be homogenously dissolved in the cleaning liquid. The content of the compound represented by the formula (7) in the cleaning liquid for lithography is preferably 0.05 to 5.0% by mass, and more preferably 0.1 to 1.0% by mass with respect to the mass of the cleaning liquid. When the compound represented by the formula (7) is added to the cleaning liquid for lithography in an amount falling within such a range, in the case in which the object to be cleaned after cleaning with the cleaning liquid is rinsed with water or the like, deposition of the compound represented by the formula (7) is readily suppressed, while achieving favorable anticorrosive effects on corrosion-prone materials. It is to be noted that two or more types of the compound represented by the formula (7) may be used in combination in the cleaning liquid for lithography.

(Surfactant)

The cleaning liquid for lithography according to the present invention may contain a surfactant as required. The solubility of a quaternary ammonium hydroxide and an anticorrosive agent in the cleaning liquid for lithography according to the present invention can be enhanced by adding a surfactant to the cleaning liquid for lithography and thus the deposition of the quaternary ammonium hydroxide and the anticorrosive agent in the cleaning liquid for lithography can be suppressed. The effect is pronounced when the cleaning liquid for lithography is in the concentrated condition in particular. Furthermore, when a surfactant is added to the cleaning liquid for lithography, wettability of the cleaning liquid for lithography is enhanced, resulting in the effect to suppress etching residue materials, etc.

The surfactant is not particularly limited and may be conventional surfactants. Specifically, nonionic surfactants, anionic surfactants, cationic surfactants, and ampholytic surfactants may be used.

The anionic surfactant is not particularly limited and may be conventional surfactants having an anionic group. The anionic surfactant may be exemplified by those having carboxylic acid group, sulfonic acid group, or phosphoric acid group as the anionic group.

Specifically, higher fatty acids, higher alkyl sulfuric acid esters, higher alkyl sulfonic acids, higher alkyl aryl sulfonic acids having an alkyl group of 8 to 20 carbon atoms, other surfactants having a sulfonic acid group, higher alcohol phosphoric acid esters, salts of these compounds, or the like may be exemplified. Here, the alkyl group of the anionic surfactants may be linear or branched; phenylene group, oxygen atom, etc. may intervene in their branched chains; and a part of hydrogen atoms in their alkyl groups may be substituted by hydroxyl group or carboxyl group.

Specific examples of the higher fatty acids include dodecanoic acid, tetradecanoic acid, stearic acid, etc.; and specific examples of the higher alkyl sulfuric acid esters may be decyl sulfuric acid ester, dodecyl sulfuric acid ester, etc. Examples of the higher alkyl sulfonic acids include decane sulfonic acid, dodecane sulfonic acid, tetradecane sulfonic acid, pentadecane sulfonic acid, stearic acid sulfonic acid, etc.

Specific examples of the higher alkyl aryl sulfonic acids include dodecylbenzene sulfonic acid, decylnaphthalene sulfonic acid, etc.

Furthermore, examples of the other surfactants having a sulfonic acid group include alkyldiphenyl ether disulfonic acids such as dodecyl diphenyl ether disulfonic acid, dialkyl sulfosuccinates such as dioctyl sulfosuccinate, etc.

Examples of the higher alcohol phosphoric acid esters include palmityl phosphoric acid ester, castor oil alkyl phosphoric acid esters, palm oil alkyl phosphoric acid esters, etc.

Among the anionic surfactants described above, surfactants having a sulfonic acid group are preferable; specifically, alkyl sulfonic acids, alkylbenzene sulfonic acids, olefin sulfonic acids, alkyl diphenyl ether sulfonic acids, alkyl naphthalene sulfonic acids, dialkyl sulfosuccinates, etc. may be exemplified. Among these, alkyl sulfonic acids, alkylbenzene sulfonic acids, alkyl diphenyl ether disulfonic acids, and dialkyl sulfosuccinates are preferable. Average carbon number of alkyl groups in the alkyl sulfonic acids is preferably 9 to 21, more preferably 12 to 18. Average carbon number of alkyl groups in the alkylbenzene sulfonic acids is preferably 6 to 18, more preferably 9 to 15. Average carbon number of alkyl groups in the alkyl diphenyl ether disulfonic acids is preferably 6 to 18, more preferably 9 to 15. Average carbon number of alkyl groups in the dialkyl sulfosuccinates is preferably 4 to 12, more preferably 6 to 10.

Among the anionic surfactants described above, alkyl sulfonic acids having an alkyl group of average carbon number 15 and alkylbenzene sulfonic acids having an alkyl group of average carbon number 12 are preferable.

The nonionic surfactants are exemplified by acetylene nonionic surfactants such as acetylene alcohol surfactants; polyoxyethylene alkyl ethers; etc. It is preferred that the nonionic surfactants are water-soluble. HLB is preferably in the range of 7 to 17. When HLB is lower and water-solubility is insufficient, the water-solubility may be imparted by mixing with other surfactants, for example.

In addition, one or more of various surfactants may be added to the cleaning liquid for lithography.

The content of the surfactant in the cleaning liquid for lithography is preferably 0.01% to 10% by mass. When the content of the surfactant is 0.01% by mass or more, the deposition of the quaternary ammonium hydroxide and the anticorrosive agent in the cleaning liquid for lithography is effectively suppressed. The effect is pronounced when the cleaning liquid for lithography is in the concentrated condition. Furthermore, when the content of the surfactant is 10% by mass or less, the influence caused by the surfactant, such as damage to a silicon substrate or an etching mask, can be reduced. The content of the surfactant in the cleaning liquid for lithography is more preferably 0.02% to 1% by mass and most preferably 0.03% to 0.5% by mass. In addition, the content of the surfactant in this connection refers to the concentration in the cleaning liquid for lithography in actual use for development processing rather than the concentration in the cleaning liquid for lithography in the concentrated condition, as described above.

Method for Forming Wiring

The method for forming a wiring according to the present invention is a method that uses a damascene method in which a metallic wiring layer is formed by embedding metal in an etching space that is formed in a dielectric layer of a semiconductor multilayer laminate using a resist film. After formation of the etching space, at least the semiconductor multilayer laminate is cleaned using the cleaning liquid for lithography according to the present invention.

The method for forming a wiring using a damascene method more specifically forms metallic wiring by using a resist pattern formed on a low dielectric constant layer of the semiconductor multilayer laminate as a mask, applying an etching process to the low dielectric constant layer to form an etching space, and then embedding metal into the etching space. A temporary sacrificial film may be embedded in the etching space.

The cleaning liquid for lithography according to the present invention can effectively remove residue materials remaining after the etching. Examples of the residue materials remaining after etching include residue materials derived from resist films, residue materials derived from sacrificial films, and residue materials derived from the low dielectric constant layers and metal wiring layers generated during etching.

There is no particular limitation on the method for removing residual material remaining after etching as long as it is a normally used removal method. More specifically, for example, use of an immersion method, a paddle method, a shower method, or the like enables processing by placing the cleaning liquid for lithography according to the present invention in direct contact for 1 to 40 minutes with the substrate. Although ambient temperature is normally used, the removal process may be performed by heating the cleaning liquid for lithography to approximately 85° C. in order to increase the removal effect.

The material forming the resist film may be a resist material customarily used in a standard method in an excimer laser (KrF, ArF, $F_2$, EUV), or used in relation to electron rays.

Use of this type of customary resist material enables formation of a resist film on an interlayer insulation layer, or on a barrier layer thereon. After using the mask to expose the resist film, a development process is applied to thereby form a resist pattern. Next, residue material of the resist pattern after execution of etching using the resist pattern as a mask is removed by the cleaning liquid for lithography according to the present invention together with other residual material originating from a sacrificial film, and originating from a low dielectric constant layer or a metallic wiring layer as a consequence of the etching.

More specifically, the low dielectric constant layer is a layer formed from a material such as a carbon-doped oxide (SiOC), methyl silsesquioxane (MSQ), or hydrogen silsesquioxane (HSQ). The low dielectric constant layers have a dielectric constant (k) of preferably 3.0 or less and more preferably 2.5 or less in order to prevent effects on the electrical characteristics of the metallic wiring layer.

These low dielectric constant layers may be formed on the metallic wiring layer, or may be formed after forming a barrier layer on the metallic wiring layer. The firing temperature for the low dielectric constant layer is normally a high temperature of 350° C. or more.

More specifically, the material forming the low dielectric constant layer as described above, that is to say, a low dielectric constant material (Low-k material) includes carbon-doped oxide black diamond (Trade Name, manufactured by Applied Materials), Coral (Trade Name, manufactured by Novelus Systems), Aurora (Trade Name, manufactured by Japan ASM) and methyl silsesquioxane-based OCL T-31, OCL T-37, OCL T-39 (All Trade Names, manufactured by Tokyo Ohka Kogyo), and hydrogen silsesquioxane-based OCD T-12, OCD T-32 (All Trade Names, manufactured by Tokyo Ohka Kogyo).

The barrier layer may be for example SiC, SiN, SiCN, Ta, TaN, or the like. This type of barrier layer may be formed between a low dielectric constant layer and a low dielectric constant layer.

The metallic material forming the metallic wiring layer used in relation to the damascene method may be mainly Cu, but a conductive material such as Al, Ti, W or the like may be laminated in addition to Cu on the same substrate. The cleaning liquid for lithography according to the present invention enables effective suppression of corrosion even when the cleaning liquid comes into direct contact with these metallic materials.

The cleaning liquid for lithography according to the present invention also finds application in a method for forming a wiring using a damascene method in which a temporary sacrificial layer is provided in an formed etching space. More specifically however, the material (embedded material) forming the sacrificial layer is suitably a spin on glass material obtained by a condensation reaction.

EXAMPLES

The present invention will be described in more detail by the following Examples, but is not limited to the Examples.
(Preparation of Cleaning Liquid for Lithography)
Cleaning liquids for lithography were prepared with the compositions and blending quantities shown in Table 1. Each reagent used was commercially available common reagent unless otherwise mentioned. The unit of the numbers shown in the table is % by mass unless otherwise mentioned.
(Evaluation of Etching Rate for Low Dielectric Constant Layer)
A film of a low dielectric constant material Aurora ULK (manufactured by ASM Japan K.K.) was formed on a silicon substrate to give a silicon substrate provided with a low dielectric constant layer with a thickness of 1500 Å. This silicon substrate was immersed in the cleaning liquid for lithography heated to 60° C. for 30 minutes. After completion of the immersion, the silicon substrate was rinsed with pure water, followed by measurement of the thickness of the low dielectric constant layer. The etching rate of the low dielectric constant layer was determined from the difference in the thicknesses before and after the immersion. The results are shown in Table 1.
(Evaluation of Removal of Etching Residue Materials)
A resin composition (manufactured by Tokyo Ohka Kogyo Co., Ltd., TBLM-800 EM) for forming a carbon hard mask (hereinafter, referred to as "C-HM") was dropwise added onto a silicon substrate. The silicon substrate was rotated at 2000 rpm to spread the composition on the whole surface of the silicon substrate to form a uniform film. Subsequently, heat treatment at 220° C. was performed for 90 seconds for drying and crosslinking of the resin to give a C-HM having a thickness of 1400 Å.

Subsequently, the C-HM was dry-etched under the following conditions to obtain etching residue materials of the C-HM (i.e., thin-film-like C-HM remaining on the silicon substrate). The thickness after dry etching was about 400 Å.
Apparatus: TCA-3822 (manufactured by Tokyo Ohka Kogyo Co., Ltd.)
Power: 800 W
Pressure: 40 Pa
Stage temperature: 40° C.
Gas: $CF_4$, 300 mL/min
Time: 3 minutes
The silicon substrate after dry etching was immersed for 15 minutes in a cleaning liquid for lithography heated to 60° C. After completion of the immersion, the silicon substrate was rinsed with pure water and was cut perpendicular to the principal plane of the silicon substrate. The cross section was observed with an SEM to confirm whether the etching residue materials were removed or not. In a case in which the etching residue materials were completely removed, the cleaning liquid for lithography was evaluated to have satisfactory ability of removing residue materials. In a case in which the etching residue materials remained, the cleaning liquid for lithography was evaluated to have poor ability of removing residue materials. The results are shown in Table 1.

TABLE 1

| | Alkali or Acid | Water-soluble organic solvent | Water | Silicon compound | Etching rate (Å/min) | Ability of removing residue materials |
|---|---|---|---|---|---|---|
| Example 1 | TMAH (0.20) | Solvent mixture (74.3) | (25) | Silane 1 (0.50) | 5.2 | Excellent |
| Example 2 | TMAH (0.20) | Solvent mixture (74.3) | (25) | Silane 2 (0.50) | 1.0 | Excellent |
| Example 3 | TMAH (0.20) | Solvent mixture (74.3) | (25) | Silane 3 (0.50) | 0.4 | Excellent |
| Example 4 | TMAH (0.20) | Solvent mixture (74.3) | (25) | Silane 4 (0.50) | 1.6 | Excellent |
| Example 5 | TMAH (0.20) | Solvent mixture (74.3) | (25) | Silane 5 (0.50) | 1.1 | Excellent |
| Example 6 | TMAH (0.20) | Solvent mixture (74.3) | (25) | Silane 6 (0.50) | 2.4 | Excellent |
| Example 7 | TMAH (0.20) | Solvent mixture (74.3) | (25) | Silane 7 (0.50) | 0.9 | Excellent |
| Example 8 | TMAH (0.20) | Solvent mixture (74.3) | (25) | Silane 8 (0.50) | 3.1 | Excellent |
| Example 9 | TMAH (0.20) | Solvent mixture (74.05) | (25) | Silane 8 (0.75) | 1.8 | Excellent |
| Example 10 | TMAH (0.20) | Solvent mixture (73.8) | (25) | Silane 8 (1.00) | 1.0 | Excellent |
| Example 11 | TMAH (0.20) | Solvent mixture (73.3) | (25) | Silane 8 (1.50) | 0.6 | Excellent |
| Example 12 | MMEA (10) | Solvent mixture (64.5) | (25) | Silane 2 (0.50) | <0.1 | Excellent |
| Example 13[1)] | TMAH (0.20) | Solvent mixture (98.5) | (0) | Silane 2 (0.50) | <0.1 | Excellent |
| Example 14 | HF (1.00) | Solvent mixture (73.5) | (25) | Silane 2 (0.50) | 0.3 | — |
| Comparative Example 1 | TMAH (0.20) | Solvent mixture (74.8) | (25) | — (0.00) | 13.2 | Excellent |
| Comparative Example 2 | TMAH (0.20) | Solvent mixture (68.8) | (25) | Silane 3 (6.00) | White turbidity[2)] | White turbidity[2)] |
| Comparative Example 3 | TMAH (0.20) | Solvent mixture (74.3) | (25) | Silane 9 (0.50) | 11.3 | Excellent |

TMAH: tetramethylammonium hydroxide
MMEA: monomethylethanolamine
HF: hydrogen fluoride
Solvent mixture: a solvent mixture (mass ratio: 6:4) of 3-methoxy-3-methyl-1-butanol (trade name: Sol Fit (registered trademark), manufactured by Kuraray Co., Ltd.) and dimethyl sulfoxide
Silane 1: trimethylmethoxysilane
Silane 2: dimethyldimethoxysilane
Silane 3: methyltrimethoxysilane
Silane 4: propyltriethoxysilane
Silane 5: dimethoxymethylphenysilane
Silane 6: 2-(3,4-epoxycyclohexyl)ethyltrimethoxysilane
Silane 7: 3-aminopropyltrimethoxysilane
Silane 8: N-2-(aminoethyl)-3-aminopropylmethyldimethoxysilane
Silane 9: phenyltrimethylsilane
[1)]0.8% by mass of propylene glycol is further contained.
[2)]evaluation was impossible because of white turbidity of the prepared cleaning liquid for lithography.

As obvious from Table 1, the cleaning liquids for lithography containing silicon compounds generating silanol groups through hydrolysis in Examples 1 to 14 could effectively remove the etching residue materials of the C-HM while inhibiting corrosion of the low dielectric constant layers.

In contrast, in Comparative Example 1, though the etching residue materials of the C-HM were effectively removed, corrosion occurred in the low dielectric constant layer because of absence of the silicon compound. In Comparative Example 2, white turbidity occurred in the prepared cleaning liquid for lithography, and thereby the etching rate of the low dielectric constant layer and the ability of removing the etching residue materials could not be evaluated. Furthermore, in Comparative Example 3, the silicon compound existing in the cleaning liquid for lithography was a silicon compound not generating a silanol group through hydrolysis, resulting in occurrence of corrosion in the low dielectric constant layer.

What is claimed is:

1. A method of cleaning a semiconductor device, comprising cleaning the semiconductor device with a cleaning liquid comprising an alkali or an acid, a solvent, and a silicon compound that generates a silanol group through hydrolysis, wherein the silicon compound, wherein the silicon compound is a alkoxysilane represented by the following formula (1) or a partial hydrolysis condensate thereof:

$$R^1{}_{4-n}Si(OR^2)_n \qquad (1)$$

wherein R1 represents an organic group, R2 represents an alkyl group having 1 to 4 carbon atoms, and n is an integer of 1 to 4.

2. The method of claim 1, wherein the amount of the silicon compound is 5% by mass or less.

3. A method of cleaning a semiconductor device, comprising cleaning the semiconductor device with a cleaning liquid comprising an alkali, a solvent, and a silicon compound that generates a silanol group through hydrolysis, wherein the alkali includes at least one selected from the group consisting of a quaternary ammonium hydroxide and an alkanolamine.

4. The method of claim 3, wherein the quaternary ammonium hydroxide is a compound represented by the following general formula (2):

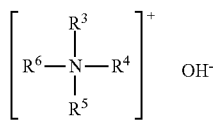

(2)

wherein R3 to R6 each independently represents an alkyl, aryl, aralkyl or hydroxyalkyl group having 1 to 16 carbon atoms.

5. The method of claim 3, wherein the amount of the quaternary ammonium hydroxide is 0.05 to 10% by mass.

6. The method of claim 3, wherein the amount of the quaternary ammonium hydroxide is 0.1 to 5% by mass.

7. The method of claim 3, wherein the amount of the alkanolamine is 0.05 to 20% by mass.

8. The method of claim 3, wherein the amount of the alkanolamine is 0.1 to 10% by mass.

9. The method of claim 1, wherein the alkali includes a combination of a quaternary ammonium hydroxide and an inorganic base.

10. The method of claim 1, wherein the acid includes hydrofluoric acid.

11. The method of claim 1, wherein the amount of the acid is 1 ppm by mass to 10% by mass.

12. The method of claim 1, wherein the amount of the acid is 100 ppm by mass to 5% by mass.

13. The method of claim 1, wherein the solvent includes an organic solvent or a combination of an organic solvent and water.

14. The method of claim 1, wherein the solvent consists of an organic solvent.

15. The method of claim 1, wherein the amount of the solvent is 1 to 99.7% by mass.

16. The method of claim 1, wherein the cleaning liquid consists essentially of the alkali or the acid, the solvent, the silicon compound, optionally an anticorrosive agent and optionally a surfactant.

17. The method of claim 1, wherein the semiconductor device is a multilayer laminate including a low dielectric constant layer.

18. The method of claim 1, wherein the alkali includes at least one selected from the group consisting of a quaternary ammonium hydroxide and an alkanolamine.

19. The method of claim 3, wherein the alkali includes a combination of a quaternary ammonium hydroxide and an inorganic base.

* * * * *